(12) United States Patent
Liao et al.

(10) Patent No.: US 7,323,721 B2
(45) Date of Patent: Jan. 29, 2008

(54) MONOLITHIC MULTI-COLOR, MULTI-QUANTUM WELL SEMICONDUCTOR LED

(75) Inventors: Shirong Liao, Diamond Bar, CA (US); Jinlin Ye, Diamond Bar, CA (US); Theeradetch Detchprohm, Schenectady, NY (US); Jyh-Chia Chen, Yorba Linda, CA (US); Yea-Chuan Milton Yeh, Santa Monica, CA (US)

(73) Assignee: Blue Photonics Inc., Walnut, CA (US)

( * ) Notice: Subject to any disclaimer, the term of this patent is extended or adjusted under 35 U.S.C. 154(b) by 219 days.

(21) Appl. No.: 11/210,847

(22) Filed: Aug. 25, 2005

(65) Prior Publication Data
US 2006/0049415 A1 Mar. 9, 2006

Related U.S. Application Data

(60) Provisional application No. 60/608,217, filed on Sep. 9, 2004.

(51) Int. Cl.
*H01L 29/201* (2006.01)
(52) U.S. Cl. .......................................... 257/90; 257/97
(58) Field of Classification Search .................. 257/89, 257/90, 96, 97, 14
See application file for complete search history.

(56) References Cited

U.S. PATENT DOCUMENTS 5,684,309 A * 11/1997 McIntosh et al. ........... 257/191

| | | |
|---|---|---|
| 6,600,175 B1 | 7/2003 | Baretz et al. |
| 6,603,258 B1 | 8/2003 | Mueller-Mach et al. |
| 6,686,691 B1 | 2/2004 | Mueller et al. |
| 6,734,467 B2 | 5/2004 | Schlereth et al. |
| 6,765,237 B1 | 7/2004 | Doxsee et al. |
| 6,828,599 B2 | 12/2004 | Kim |
| 6,841,802 B2 | 1/2005 | Yoo |
| 6,841,934 B2 | 1/2005 | Wang et al. |
| 6,850,002 B2 | 2/2005 | Danielson et al. |
| 6,858,869 B2 | 2/2005 | Fujiwara |
| 6,919,584 B2 | 7/2005 | Wang et al. |

OTHER PUBLICATIONS

Schlotter, P et al.: "Luminescence Conversion of Blue Light Emitting Diodes," Applied Physics A: Materials Science & Processing, vol. 64, No. 4, Apr. 1997, pp. 417-418.
Chen, Chin-Hsiang et al.: "InGaN/GaN multiple-quantum-well dual-wavelength near-white light emitting diodes," published in Phys. Stat. Sol., No. 7, 2003, pp. 2257-2260.

* cited by examiner

*Primary Examiner*—Mark V. Prenty
(74) *Attorney, Agent, or Firm*—McDermott Will & Emery LLP

(57) ABSTRACT

A monolithic, multi-color semiconductor light emitting diode (LED) is formed with a multi-bandgap, multi-quantum well (MQW) active light emitting region which emits light at spaced-apart wavelength bands or regions ranging from UV to red. The MQW active light emitting region comprises a MQW layer stack including n quantum barriers which space apart n−1 quantum wells. Embodiments include those wherein the MQW layer stack includes quantum wells of at least two different bandgaps for emitting light of two different wavelengths, e.g., in the blue or green regions and in at least one other region, and the intensities of the emissions are adjusted to provide a preselected color of combined light emission, preferably white light.

10 Claims, 2 Drawing Sheets

MONOLITHIC MULTI-COLOR, MULTI-QUANTUM WELL SEMICONDUCTOR LED

CROSS-REFERENCE TO PROVISIONAL APPLICATION

This application claims priority from U.S. Provisional Patent Application No. 60/608,217 filed Sep. 9, 2004, the entire disclosure of which is incorporated herein by reference.

FIELD OF THE DISCLOSURE

The present disclosure relates to semiconductor light-emitting diodes (LEDs) that emit multiple colors of light. More particularly, the present disclosure relates to monolithic white-light LEDs with unique multi-quantum well (MQW) structures.

BACKGROUND OF THE DISCLOSURE

Gallium nitride (GaN) III-V compound semiconductor-based light-emitting diodes (LEDs) typically exhibit excellent light emission characteristics. Theoretically, LED emission from GaN-based III-V compound semiconductors, such as InGaN, AlGaN, AlInGaN, and GaN, can cover the entire visible light spectrum from short wavelengths (i.e., UV) to longer wavelengths (i.e., red light).

Blue and green GaN-based LED's have been extensively utilized in industrial applications, and presently white light GaN-based LED's are attracting increased attention for use in display and lighting applications. Currently, white light emitting GaN-based LEDs may be fabricated in several different ways. One approach for fabricating white light emitting GaN-based LEDs is to combine a phosphor-based wavelength converter with a GaN-based LED which emits UV or blue light. According to this approach, some or all of the UV or blue light emitted by the LED is absorbed by the phosphor material(s) and re-emitted as longer wavelength light. White light is generated when the phosphor material(s) re-emit light of lower energies (longer wavelengths) and one or more different wavelength bands of the re-emitted light combine to form white light. One type of phosphor-based wavelength converter utilized in such applications is a cerium (Ce)-doped yttrium-aluminum garnet (YAG:Ce) material.

According to another approach for fabricating white light emitting GaN-based LEDs, devices are formed comprising a pair of active, i.e., light-emitting, regions, e.g., a InGaN-based primary, blue light emitting active region and an AlGaInP-based secondary, light converting region. In operation, a fraction of the blue light emitted by the InGaN-based primary, blue light emitting active region is absorbed by the AlGaInP-based secondary, light converting region and re-emitted as lower energy (longer wavelength) photons. White light is perceived as emitting from the device when the two light sources have an appropriate intensity ratio and wavelengths.

Still another approach for fabricating white light emitting LEDs involves combining two or more different LEDs, e.g., red, green, and blue LEDs, wherein each LED semiconductor chip is provided with its own current supply. The LEDs emit photons at selected different wavelengths and power ratio resulting in perceived white light. A drawback of this approach is the requirement for complex driving circuitry for operating the LEDs in concert and the large package size.

According to yet another approach for fabricating GaN-based white light emitting LEDs, two complementary-wavelength active LED junction regions are formed in series on a single substrate, e.g., consisting of an InGaN/GaN multiple quantum well (MQW) region with low indium (In) concentration and an InGaN/GaN MQW region with high indium (In) concentration. The former MQW region provides LED emission of blue light and the latter MQW region provides LED emission with green light, the combination being perceived as white light.

However, fabrication of white light emitting GaN-based LEDs according to each of the above-described approaches entails increased manufacturing complexity, cost, and specific drawbacks such as poor device reliability. Accordingly, it is considered that a new approach for fabrication of white light emitting GaN-based LEDs which offers simple processing and low manufacturing cost not requiring expensive post processing wafer bonding and packaging is desirable. In addition, there is a need for improved GaN-based white light emitting LEDs which avoid the need for short lifetime phosphor-based wavelength converters and thus exhibit superior reliability, improved power utilization efficiency, lower forward operating voltage, and little or no spectrum shifts when the emitted light is viewed at different distances and angles.

SUMMARY OF THE DISCLOSURE

The present disclosure relates to improved semiconductor light-emitting diodes (LEDs) comprising a novel monolithic, multi-bandgap, multi-quantum well (MQW) structure for producing white light or light of a preselected color.

One advantage of the present disclosure is an improved method for fabricating a monolithic, multi-bandgap, MQW semiconductor LED having a preselected color of light emission.

Additional advantages and other features of the present disclosure will be set forth in the description which follows and in part will become apparent to those having ordinary skill in the art upon examination of the following or may be learned from the practice of the present disclosure. The advantages may be realized and obtained as particularly pointed out in the appended claims.

According to an aspect of the present disclosure, the foregoing and other advantages are achieved in part by an improved monolithic, multi-color semiconductor light emitting diode (LED), comprising a multi-bandgap, multi-quantum well (MQW) active light emitting region which emits light at at least two spaced-apart wavelength bands or regions ranging from UV to red regions.

In accordance with embodiments of the present disclosure, the multi-bandgap, MQW active light emitting region comprises a MQW layer stack including n quantum barriers which space apart n−1 quantum wells; the MQW layer stack includes quantum wells of at least two different bandgaps; and the intensity of light emission at each of the at least two spaced-apart wavelength bands or regions is adjusted and combined to provide a resultant (i.e., combined) color of light emission. Advantageously, the resultant color can be that of white light, in which instance the multi-bandgap, MQW active light emitting region includes quantum wells for emitting light in the blue or green wavelength regions and in at least one other region.

In accordance with embodiments of the disclosure, each of the quantum wells comprises nitride-based III-V compound semiconductors including at least nitrogen (N), and the LED includes a plurality of stacked GaN-based semiconductor layers epitaxially formed on a surface of a substrate. The plurality of stacked layers can comprise, in sequence from said substrate surface, at least one nucleation/buffer layer including an uppermost N-type layer, a multi-bandgap, MQW layer stack, and at least one P-type layer.

According to an embodiment of the present disclosure, the multi-bandgap, MQW layer stack comprises, in overlying sequence from the at least one nucleation/buffer layer, a quantum barrier, a deep blue quantum well, a quantum barrier, a $1^{st}$ green quantum well, a quantum barrier, a $2^{nd}$ green quantum well, a quantum barrier, a $3^{rd}$ green quantum well, a quantum barrier, a $1^{st}$ blue quantum well, a quantum barrier, a $2^{nd}$ blue quantum well, and a quantum barrier, wherein each of the quantum barriers is about 12 nm thick and comprised of GaN; the deep blue quantum well is about 3 nm thick, comprised of $In_xGa_{1-x}N$, where x is about 0.16, and has a very weak emission peak at about 428 nm; each of the $1^{st}$, $2^{nd}$, and $3^{rd}$ green quantum wells is about 3 nm thick, comprised of $In_xGa_{1-x}N$, where x is about 0.32, and has an emission peak at about 533 nm; and each of the $1^{st}$ and $2^{nd}$ blue quantum wells is about 3 nm thick, comprised of $In_xGa_{1-x}N$, where x is about 0.19, and has an emission peak at about 445 nm.

Another aspect of the present disclosure is an improved method of fabricating a monolithic semiconductor light-emitting diode (LED) which emits light of a preselected color, the method comprising forming over a substrate a multi-bandgap, multi-quantum well (MQW) active light emitting region of the device which emits light at at least two spaced-apart wavelength bands or regions, and adjusting the intensity of light emission at each of the at least two spaced-apart wavelength bands or regions such that they combine to provide the preselected color.

In an embodiment of the present disclosure, the multi-bandgap, MQW active light emitting region comprises a MQW layer stack which includes n quantum barriers which space apart n–1 quantum wells, the MQW layer stack includes quantum wells of at least two different bandgaps, and the multi-bandgap, MQW active light emitting region includes quantum wells for emitting light in UV to red wavelength bands or regions.

According to embodiments of the present disclosure, the preselected color is white light, and the multi-bandgap, MQW active light emitting region includes quantum wells for emitting light in the green or blue regions and in at least one other region.

Additional advantages of the present disclosure will become readily apparent to those skilled in the art from the following detailed description, wherein only the preferred embodiments of the present disclosure are shown and described, simply by way of illustration but not limitation. As will be realized, the disclosure is capable of other and different embodiments, and its several details are capable of modification in various obvious respects, all without departing from the spirit of the present disclosure. Accordingly, the drawings and description are to be regarded as illustrative in nature, and not as restrictive.

BRIEF DESCRIPTION OF THE DRAWINGS

The following detailed description of the embodiments of the present disclosure can best be understood when read in conjunction with the following drawings, in which the same reference numerals are employed throughout for designating similar features, which features are not necessarily drawn to scale but rather are drawn as to best illustrate the pertinent features, wherein.

DETAILED DESCRIPTION OF THE DISCLOSURE

The present disclosure has been made with the aim of providing white light emitting GaN-based LEDs and fabrication methods therefore, which avoid the drawbacks and disadvantages of the above-described conventional approaches. Accordingly, the novel approach for fabrication of white light emitting GaN-based LEDs afforded by the present disclosure offers simple processing and low manufacturing cost not requiring expensive post processing/packaging, as well as eliminating the need for short lifetime phosphor-based wavelength converters, whereby white light (or light of other desired color) emitting GaN-based LEDs according to the present disclosure exhibit superior reliability, improved power utilization efficiency, lower forward operating voltage, and little or no spectrum shifts when the emitted light is viewed at different distances and angles. In addition, white light emitting GaN-based LEDs according to the present disclosure can be fabricated utilizing conventional III-V compound semiconductor manufacturing methodologies and technologies.

Figure 1:
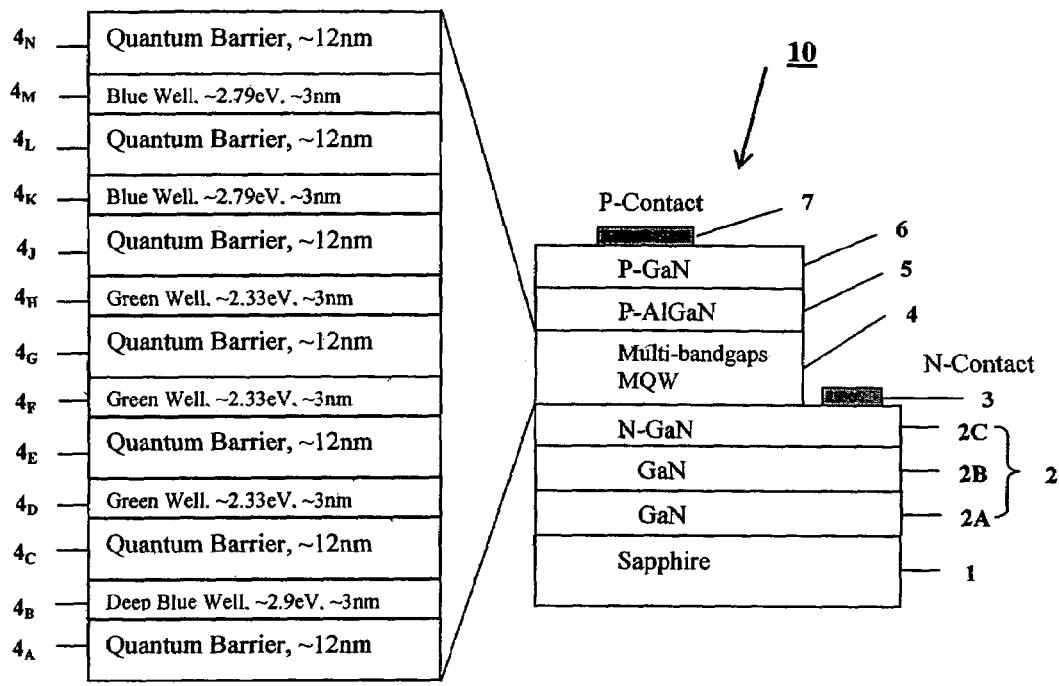
FIG. 1 is a simplified, schematic cross-sectional view, of a portion of an illustrative, but non-limitative, embodiment of a monolithic white light emitting GaN-based MQW LED 10 according to the present disclosure.

Referring to FIG. 1, shown therein in simplified schematic cross-sectional view, is a portion of an illustrative, but non-limitative, embodiment of a preferred monolithic white light emitting GaN-based MQW LED 10 according to the present disclosure. LED 10, which can be formed by conventional epitaxial deposition techniques, comprises a suitable substrate 1 for epitaxial deposition thereon, e.g., a GaN or GaAs wafer, sapphire ($Al_2O_3$), and silicon carbide (SiC), illustratively sapphire, with a nucleation/buffer layer 2 formed thereon, comprised of a GaN nucleation layer 2A, e.g., of about 10 nm thickness, in contact with the surface of substrate 1, an overlying undoped GaN buffer layer 2B about 1 μm thick, and an overlying about 4 μm thick N-doped GaN buffer layer 2C, e.g., comprising Si as N-type dopant. Overlying N-GaN layer 2C is multi-bandgap, multi-quantum well (MQW) active region 4, e.g., comprised of $In_xGa_{1-x}N$ and GaN.

As illustrated in detail in FIG. 1, multi-bandgap, multi-quantum well (MQW) active region 4 comprises a stacked plurality of quantum barriers $4_A$, $4_C$, $4_E$, $4_G$, $4_J$, $4_L$, and $4_N$ with respective intervening green quantum wells $4_D$, $4_F$, and $4_H$, deep blue quantum well $4_B$, and blue quantum wells $4_K$ and $4_M$. Each of the quantum barriers $4_A$, $4_C$, $4_E$, $4_G$, $4_J$, $4_L$ and $4_N$ is about 12 nm thick and comprised of GaN; each of the green quantum wells $4_D$, $4_F$, and $4_H$ is about 3 nm thick and comprised of $In_xGa_{1-x}N$ with a bandgap of about 2.33 eV; the deep blue quantum well $4_B$ is about 3 nm thick and comprised of $In_xGa_{1-x}N$ with a bandgap of about 2.9 eV; and each of the blue quantum wells $4_K$ and $4_M$ is about 3 nm thick and comprised of $In_xGa_{1-x}N$ with a bandgap of about 2.79 eV.

According to the disclosure, each of the GaN-based quantum barriers $4_A$, $4_C$, $4_E$, $4_G$, $4_J$, $4_L$, and $4_N$, may, if desired, include a minor amount of indium (In). The quantum barriers function to trap injected minority carriers inside the respective quantum wells in order to enhance spontaneous light emission therefrom. Typically, the bandgap of the quantum barrier is greater than that of the associated quantum well and its thickness is selected to avoid high forward voltage and excessive heating which can lead to performance degradation.

Still referring to FIG. 1, overlying MQW active region 4 of LED 10 are a pair of P-doped layers having a combined thickness of about 0.3 μm, respectively comprised of a Mg-doped P—AlGaN layer 5 and a Mg-doped P—GaN layer 6. Finally, ohmic contacts 3 and 7 are provided for electrically contacting layers 2 and 6, respectively.

Figure 2:
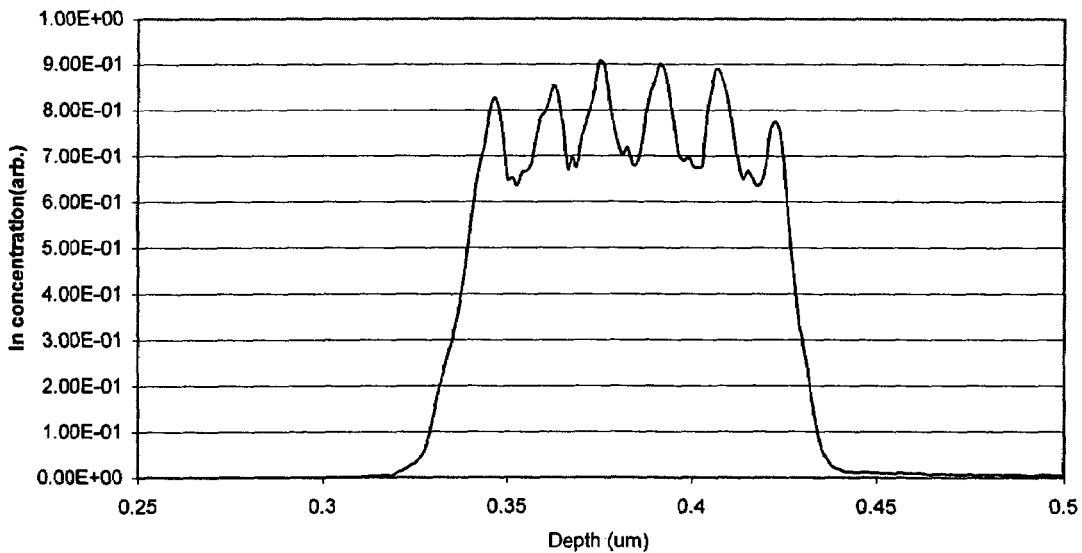
FIG. 2 is a graph indicating the SIMS profile of the indium (In) concentration of the multi-bandgap MQW active region of LED 10 of FIG. 1.

Adverting to FIG. 2, shown therein is a graph indicating the SIMS profile of the indium (In) concentration in a multi-bandgap MQW active region of an LED according to the present disclosure, such as MQW active region 4 of LED 10 of FIG. 1, comprising 6 quantum wells. As is evident from FIG. 2, the $2^{nd}$, $3^{rd}$, and $4^{th}$ quantum wells, i.e., the green wells, have the same In concentration of about 32 at. %, i.e., $Ga_{0.68}In_{0.32}N$; the $1^{st}$ quantum well, the deep blue quantum well, has an In concentration of about 16 at. %, i.e., $Ga_{0.84}In_{0.16}N$; whereas the $5^{th}$, and $6^{th}$ quantum wells, i.e., the blue wells, have the same In concentration of about 19 at. %, i.e., $Ga_{0.81}In_{0.19}N$.

Figure 3:
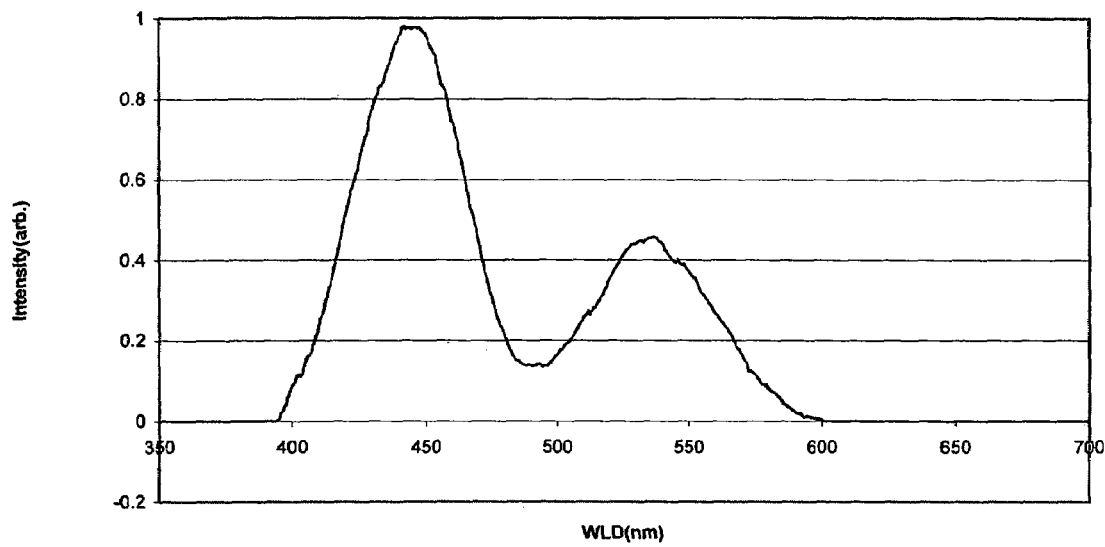
FIG. 3 is a graph illustrating the electroluminescent (EL) spectrum of the monolithic, white light-emitting MQW LED 10 of FIG. 1.

FIG. 3 is a graph illustrating the electroluminescent (EL) spectrum of the monolithic, white light-emitting MQW LED 10 of FIG. 1. The intensity peak at the shorter wavelength region (445 nm) arises from the $1^{st}$, $5^{th}$, and $6^{th}$ quantum wells, i.e., the blue wells, and the intensity peak at the longer wavelength region (533 nm) arises from the $2^{nd}$, $3^{rd}$, and $4^{th}$ quantum wells, i.e., the green wells.

Figure 4:
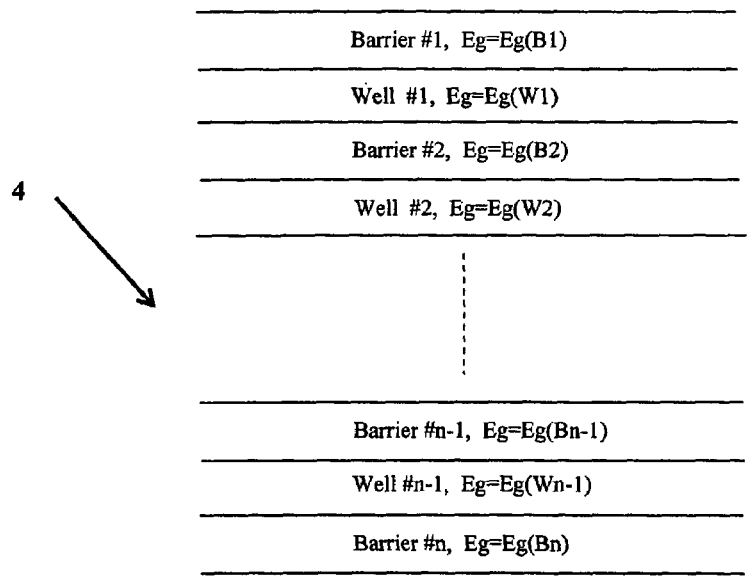
FIG. 4 is a simplified, schematic cross-sectional view of a generalized representation of a MQW active region of monolithic multi-color or white light emitting MQW LEDs according to the present disclosure.

With reference to FIG. 4, shown therein, in simplified, schematic cross-sectional view, is a generalized representation of a MQW active region 4 of a monolithic multi-color or white light emitting MQW LED according to the disclosure, e.g., LED 10 of FIG. 1. As illustrated, the MQW active region 4 may comprise n quantum barriers and n−1 quantum wells (as numbered from the uppermost to the lowermost strata of region 4), wherein n is an integer with a minimum value of 3 (i.e., a minimum of 2 quantum wells), $E_g(B_n)$ denotes the bandgap energy of the $n^{th}$ barrier, and $E_g(W_{n-1})$ denotes the bandgap energy of the $(n-1)^{th}$ well.

It is emphasized that, according to the present disclosure, the numbers n and n−1 of quantum barriers and wells of MQW active region 4 are not limited to those shown in the above-described illustrative embodiment; nor are the bandgaps and thicknesses limited to those shown in the illustrative embodiment. Rather, the numbers of quantum wells and barriers, and their bandgaps and thicknesses may be different from those of the illustrative embodiment. More specifically, according to the present disclosure, the number of quantum wells and barriers and their thickness(es) may be adjusted to controllably vary the intensity ratio of the emitted photons of different energies (wavelengths). The bandgap of each of the quantum wells, hence the color of the light emitted by each quantum well, is controlled by appropriate adjustment of the In concentration of the well, and therefore may range from the UV region to the red region. As a consequence, MQW LEDs according to the present disclosure can be tailored as to emit light of multiple wavelength bands which are combinable to yield white light or light of a desired color. Moreover, the concept of the present disclosure is not limited to the nitride-based III-V compound semiconductor system of the illustrated embodiment, but rather is generally applicable to other and different semiconductor systems.

As indicated above, monolithic, multi-color or white light emitting MQW LED's according to the present disclosure may be readily fabricated by means of conventional methodologies and technologies for epitaxial deposition of Ill-V compound semiconductors. Suitable epitaxial deposition techniques for use in practicing the present disclosure include, but are not limited to, hydride vapor phase epitaxy (HVPE), organometallic vapor phase epitaxy (OMVPE), and molecular beam epitaxy (MBE). The GaN-based III-V semiconductor layers can, for example, be comprised of $Al_xGa_yIn_{1-x-y}N$, where $0 \leq x \leq 1$, $0 \leq y \leq 1$, and $0 \leq x+y \leq 1$; the Ga source may be TMGa or TEGa; the Al source may be TMAl or TEAl; the indium source may be TMIn or TEIn; the N source may be $NH_3$; the P-type dopant may be selected from among Zn, Cd, Be, Mg, Ca, and Ba; the N-type dopant may be selected from among Si, Ge, and Sn; and the carrier gas may be selected from among $H_2$, $N_2$, other inert gases, and combinations of the aforementioned gases.

The present disclosure provides improved monolithic, multi-color or white light emitting MQW GaN-based LEDs while affording a number of advantages vis-à-vis conventional GaN-based multi-color and white light emitting LEDs, including, inter alia, superior reliability, improved power utilization efficiency, lower forward operating voltage, little or no spectrum shifts when the emitted light is viewed at different distances and angles, and do not require extra wafer bonding and post packaging processing. In addition, monolithic, multi-color and white light emitting GaN-based LEDs according to the present disclosure can be readily fabricated utilizing conventional III-V compound semiconductor manufacturing methodologies and technologies.

In the previous description, numerous specific details are set forth, such as specific materials, structures, processes, etc., in order to provide a better understanding of the present disclosure. However, the present disclosure can be practiced without resorting to the details specifically set forth. In other instances, well-known processing materials and techniques have not been described in detail in order not to unnecessarily obscure the present disclosure.

Only the preferred embodiments of the present disclosure and but a few examples of its versatility are shown and described in the present disclosure. It is to be understood that the present disclosure is capable of use in various other combinations and environments and is susceptible of changes and/or modifications within the scope of the disclosed concept as expressed herein.

What is claimed is:

1. A monolithic, multi-color semiconductor light emitting diode (LED), comprising a multi-bandgap, multi-quantum well (MQW) active light emitting region that emits light at a plurality of spaced-apart wavelength bands or regions ranging from UV to red bands or regions, said multi-bandgap, MQW active light emitting region comprising a MQW layer stack including a plurality of quantum wells spaced apart by respective quantum barriers, wherein said multi-bandgap, MQW layer stack comprises, in overlying sequence, a quantum barrier, a deep blue quantum well, a quantum barrier, a $1^{st}$ green quantum well, a quantum barrier, a $2^{nd}$ green quantum well, a quantum barrier, a $3^{rd}$ green quantum well, a quantum barrier, a 1$^{st}$ blue quantum well, a quantum barrier, a 2$^{nd}$ blue quantum well, and a quantum barrier.

2. The LED as in claim 1, wherein the intensity of light emission at each of said at spaced-apart wavelength bands or regions is adjusted and combined to provide a resultant color of light emission.

3. The LED as in claim 2, wherein said resultant color is white light.

4. The LED as in claim 1, wherein each of said quantum wells comprises nitride-based III-V compound semiconductors including at least nitrogen (N).

5. The LED as in claim 1, including a plurality of stacked GaN-based semiconductor layers epitaxially formed on a surface of a substrate.

6. The LED as in claim 5, wherein said plurality of stacked layers comprises, in sequence from said substrate surface, at least one nucleation/buffer layer including an uppermost N-type layer, a said multi-bandgap, MQW layer stack, and at least one P-type layer.

7. The LED as in claim 1, wherein each of said quantum barriers is about 12 nm thick and comprised of GaN; said deep blue quantum well is about 3 nm thick, comprised of In$_x$Ga$_{1-x}$N with x equal to about 0.16, and has an emission peak at about 428 nm; each of said 1$^{st}$, 2$^{nd}$, and 3$^{rd}$ green quantum wells is about 3 nm thick, comprised of In$_x$Ga$_{1-x}$N with x equal to about 0.32, and has an emission peak at about 533 nm; and each of said 1$^{st}$ and 2$^{nd}$ blue quantum wells is about 3 nm thick, comprised of In$_x$Ga$_{1-x}$N with x equal to about 0.19, and has an emission peak at about 445 nm.

8. A method of fabricating a monolithic semiconductor light-emitting diode (LED) which emits light of preselected color, the method comprising steps of:
(a) forming over a substrate a multi-bandgap, multi-quantum well (MQW) active light emitting region which emits light at a plurality of spaced-apart wavelength bands or regions, said MQW active light emitting region comprising a MQW layer stack including a plurality of quantum wells spaced apart by respective quantum barriers, wherein said multi-bandgap, MQW layer stack comprises, in overlying sequence, a quantum barrier, a deep blue quantum well, a quantum barrier, a 1$^{st}$ green quantum well, a quantum barrier, a 2$^{nd}$ green quantum well, a quantum barrier, a 3$^{rd}$ green quantum well, a quantum barrier, a 1$^{st}$ blue quantum well, a quantum barrier, a 2$^{nd}$ blue quantum well, and a quantum barrier; and
(b) adjusting the intensity of light emission at each of said plurality of spaced-apart wavelength bands or regions such that they combine to provide said preselected color.

9. The method according to claim 8, wherein:
step (a) comprises forming said MQW active region such that each of said quantum barriers is about 12 nm thick and comprised of GaN; said deep blue quantum well is about 3 nm thick, comprised of In$_x$Ga$_{1-x}$N with x equal to about 0.16, and has an emission peak at about 428 nm; each of said 1$^{st}$, 2$^{nd}$ and 3$^{rd}$ green quantum wells is about 3 nm thick, comprised of In$_x$Ga$_{1-x}$N with x equal to about 0.32, and has an emission peak at about 533 nm; and each of said 1$^{st}$ and 2$^{nd}$ blue quantum wells is about 3 nm thick, comprised of In$_x$Ga$_{1-x}$N with x equal to about 0.19, and has an emission peak at about 445 nm.

10. The method according to claim 8, wherein:
step (b) comprises adjusting the intensity of light emission at each of said plurality of spaced-apart wavelength bands or regions such that they combine to provide white light.

* * * * *